United States Patent
Narayanan et al.

(10) Patent No.: US 9,564,210 B2
(45) Date of Patent: Feb. 7, 2017

(54) AGING SENSOR FOR A STATIC RANDOM ACCESS MEMORY (SRAM)

(71) Applicant: QUALCOMM Incorporated, San Diego, CA (US)

(72) Inventors: Venkatasubramanian Narayanan, San Diego, CA (US); Alex Dongkyu Park, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/720,930

(22) Filed: May 25, 2015

(65) Prior Publication Data

US 2016/0351250 A1  Dec. 1, 2016

(51) Int. Cl.
G11C 11/00 (2006.01)
G11C 11/417 (2006.01)
H01L 27/11 (2006.01)

(52) U.S. Cl.
CPC .......... *G11C 11/417* (2013.01); *H01L 27/1116* (2013.01)

(58) Field of Classification Search
CPC ............................ H01L 21/823807; G11C 8/08
USPC ................................................... 365/154, 200
See application file for complete search history.

(56) References Cited

U.S. PATENT DOCUMENTS

| | | | |
|---|---|---|---|
| 6,212,115 B1 | 4/2001 | Jordan | |
| 7,683,653 B2 | 3/2010 | Valentian | |
| 8,320,183 B2 | 11/2012 | Ha et al. | |
| 8,402,207 B2 | 3/2013 | Chen et al. | |
| 8,422,303 B2 | 4/2013 | Franca-Neto et al. | |
| 2004/0095800 A1 | 5/2004 | Lin et al. | |
| 2005/0105315 A1 | 5/2005 | Shin et al. | |
| 2007/0018678 A1* | 1/2007 | Puchner | G11C 29/028 324/762.09 |
| 2008/0091995 A1 | 4/2008 | Baik et al. | |
| 2012/0096323 A1 | 4/2012 | Tachibana | |
| 2013/0205075 A1 | 8/2013 | Twitto et al. | |
| 2014/0177323 A1* | 6/2014 | Hegde | G11C 11/419 365/154 |
| 2015/0063010 A1 | 3/2015 | Kawa et al. | |
| 2015/0221364 A1* | 8/2015 | Hiramoto | G11C 11/419 365/72 |

OTHER PUBLICATIONS

International Search Report and Written Opinion—PCT/US2016/030448—ISA/EPO—Jun. 24, 2016.

* cited by examiner

*Primary Examiner* — Anthan Tran
(74) *Attorney, Agent, or Firm* — Muncy, Geissler, Olds & Lowe, P.C.

(57) ABSTRACT

A static random access memory (SRAM) includes a first bitcell and a second bitcell. The first bitcell includes an aging transistor and the second bitcell includes a non-aging transistor. An aging sensor is coupled between the first bitcell and the second bitcell to determine an amount of aging associated with the aging transistor. In one aspect, the amount of aging associated with the aging transistor is determined based on a difference between a voltage or current associated with the aging transistor and a voltage or current associated with the non-aging transistor.

22 Claims, 12 Drawing Sheets

FIG. 6

AGING SENSOR FOR A STATIC RANDOM ACCESS MEMORY (SRAM)

FIELD OF DISCLOSURE

Aspects of the present disclosure relate generally to memories and in particular to aging sensors for static random access memory (SRAM).

BACKGROUND

There are several different types of memory devices and/or systems used in caches for computing environments, each having its own advantages and disadvantages. A static random access memory (SRAM) is commonly used in applications where access speed is a consideration. A conventional SRAM includes an array of bitcells. One traditional bitcell, i.e., a 6T bitcell, has two p-channel metal oxide semiconductor (PMOS transistor) transistors and four n-channel metal oxide semiconductor (NMOS) transistors.

In an SRAM bitcell, when writing data there is at least one NMOS transistor and at least one PMOS transistor that is subject to aging. One aging mechanism is called bias temperature instability. Bias temperature instability can be negative or positive, depending on the type of complementary metal-oxide-semiconductor (CMOS) transistor.

For example, a PMOS transistor commonly experiences negative bias temperature instability (NBTI) whereas an NMOS transistor commonly experiences positive bias temperature instability (PBTI). Negative bias temperature instability (NBTI) occurs when a PMOS transistor device continually experiences a negative bias across its gate oxide, with a low drain to source voltage. Positive bias temperature instability (PBTI) occurs when an NMOS device continually experiences a positive bias across its gate oxide with a low drain to source voltage. Aging due to both positive and negative bias temperature instability is currently the dominant aging mechanism in SRAM.

In an SRAM, $V_{DD}$ is the upper rail supply voltage or operating voltage, whereas $V_{DDMIN}$ can be characterized as the lowest voltage at which an SRAM bitcell can be reliably read from or written to for a given time. That is, $V_{DDMIN}$ is the voltage just above the voltage at which the first SRAM bitcell begins to fail. Foundries that create SRAM bitcells provide a conservative flat guard band for $V_{DDMIN}$ as commonly $V_{DDMIN}$ may increase due to aging in the SRAM transistors. Because the flat guard band is conservative, since it has to take into account the worst possible scenarios—i.e. the worst case stress conditions, worst case temperature, effects of aging, etc., what is needed is a technique to measure aging of an SRAM.

SUMMARY

One implementation of the technology described herein is directed to a static random-access memory (SRAM) array, comprising a first bitcell having an aging transistor; a second bitcell having a non-aging transistor; and an aging sensor coupled between the first bitcell and the second bitcell, wherein the aging sensor is configured to determine an amount of aging associated with the aging transistor based on a difference between a voltage or a current associated with the aging transistor and a voltage or a current associated with the non-aging transistor.

Another implementation is directed to a method of fabricating a static random-access memory (SRAM) array, comprising: coupling an aging sensor between a first bitcell in the static random-access memory (SRAM) array and a second bitcell in the static random-access memory (SRAM) array; and configuring the aging sensor to determine an amount of aging for an aging transistor in the first bitcell and a non-aging transistor in the second bitcell based on a difference between a current associated with the aging transistor and a current associated with the non-aging transistor.

Another implementation is directed to a static random-access memory (SRAM) array, comprising: means for determining an amount of aging associated with an aging transistor based on a difference between a voltage or a current associated with the aging transistor and a voltage or a current associated with an non-aging transistor; and means for adjusting a $V_{DD}$ associated with the first and second bitcells based on the amount of aging determined for the aging transistor.

Above is a simplified Summary relating to one or more implementations described herein. As such, the Summary should not be considered an extensive overview relating to all contemplated aspects and/or implementations, nor should the Summary be regarded to identify key or critical elements relating to all contemplated aspects and/or implementations or to delineate the scope associated with any particular aspect and/or implementation. Accordingly, the Summary has the sole purpose of presenting certain concepts relating to one or more aspects and/or implementations relating to the mechanisms disclosed herein in a simplified form to precede the detailed description presented below.

BRIEF DESCRIPTION OF THE DRAWINGS

The accompanying drawings are presented to aid in the description of the technology described herein and are provided solely for illustration of the implementations and not for limitation of the implementations.

DETAILED DESCRIPTION

In general, the subject matter disclosed herein is directed to systems, methods, and apparatuses for determining aging of an SRAM bitcell. In one or more implementations, an aging sensor is interposed between two bitcells. The aging sensor is interposed in such a way that the currents through aging PMOS transistor in one bitcell and the non-aging PMOS transistor in another bitcell are able to be sensed. During normal memory operations of the SRAM, the same data may be stored on the two bitcells. However, during sensing of the aging of a PMOS transistor one or more bits may need to be modified, as will be described in more detail below. One PMOS transistor per bitcell is exposed to aging stress while the other PMOS transistor on the same bitcell is not exposed to aging stress. By sensing the currents through the aging PMOS transistor in one bitcell and the non-aging PMOS transistor in the other bitcell the aging sensor can arrive at a comparison of the two PMOS transistors.

Figure 1A:
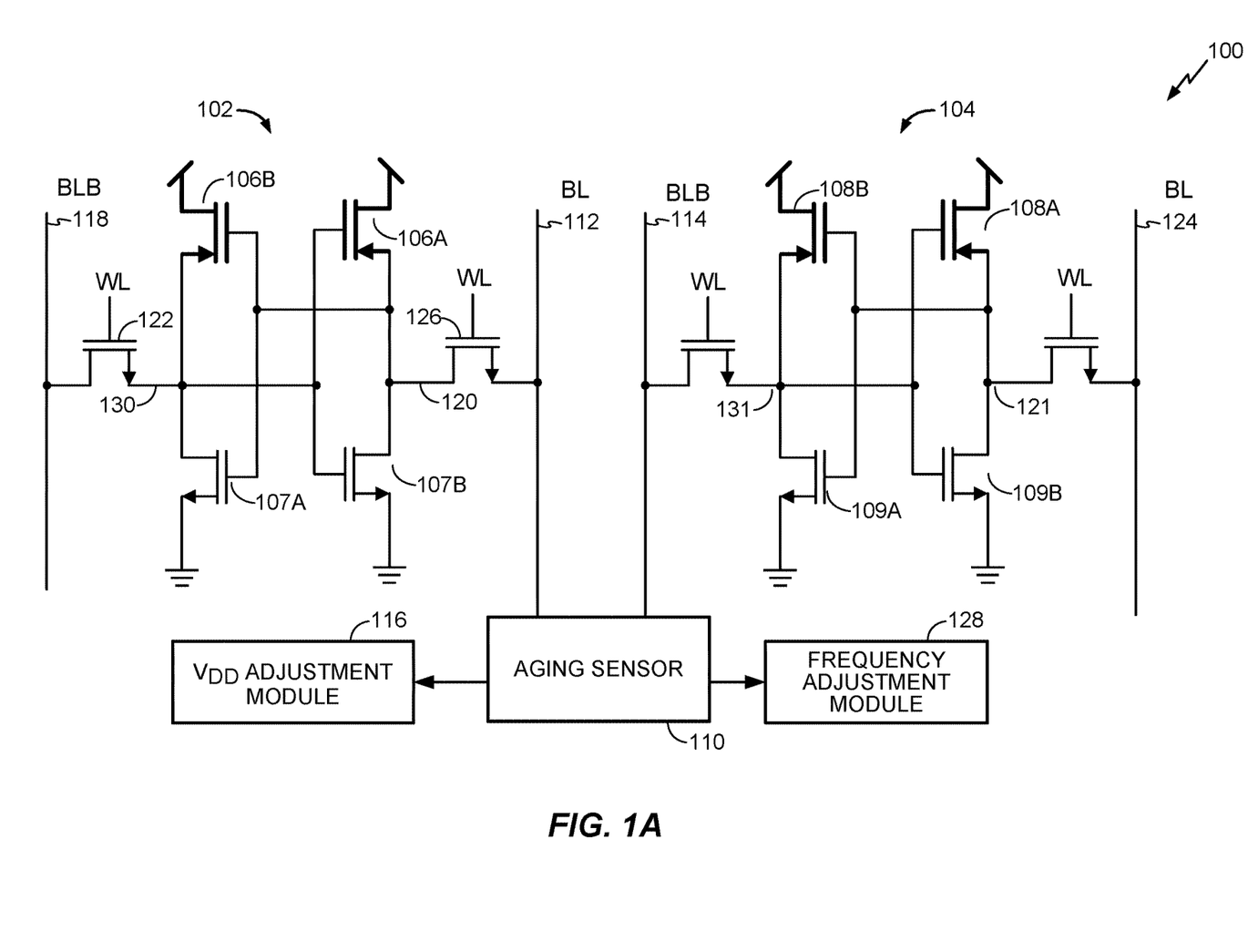
FIG. 1A is a schematic diagram of a static random-access memory (SRAM) according to one or more implementations of the technology described herein.

FIG. 1A is a schematic diagram of a static random-access memory (SRAM) 100 according to one or more implementations of the technology described herein. The illustrated SRAM 100 includes a first bitcell 102 and a second bitcell 104. First bitcell 102 and second bitcell 104 are two possible bitcells included in an SRAM array that includes several bitcells (not shown in FIG. 1A for ease of explanation). The first bitcell 102 includes an aging PMOS transistor 106A, a non-aging PMOS transistor 106B, an aging NMOS transistor 107A, and a non-aging NMOS transistor 107B. Similarly, second bitcell 104 includes an aging PMOS transistor 108A, a non-aging PMOS transistor 108B, an aging NMOS transistor 109A, and a non-aging NMOS transistor 109B. The illustrated SRAM 100 includes an aging sensor 110. The bitcell 102 is coupled to a bit line BL 112, while the bitcell 104 is coupled to a complementary bit line BLB 114. The bit line BL 112 and the complementary bit line BLB 114 are coupled to the aging sensor 110. The illustrated SRAM 100 includes a $V_{DD}$ adjustment module 116, a complementary bit line BLB 118, a bit line BL 124, and nodes 120, 121, 130, and 131. The illustrated SRAM 100 also includes an optional frequency adjustment module 128. The SRAM 100 may be fabricated by coupling the components as illustrated in FIG. 1A.

The illustrated $V_{DD}$ adjustment module 116 may adjust $V_{DD}$ for the SRAM 100 as appropriate based on the output of the aging sensor 110. In one aspect, $V_{DD}$ is a supply voltage coupled to drive one or more of bitlines 112, 114, 118, and 124. The illustrated frequency adjustment module 128 can adjust the frequency of operation (i.e., clock frequency) of the SRAM 100 as appropriate based on the output of the aging sensor 110. Clock frequency and $V_{DD}$ may both be adjusted in some implementations. In other implementations, the clock frequency may be maintained constant and $V_{DD}$ may be adjusted. In still other implementations, the clock frequency may be adjusted while keeping $V_{DD}$ constant.

In one embodiment, the bitcells 102 and 104 are both designed to maintain the same data pattern during the operation of the SRAM 100. Each of the bitcells 102 and 104 has a PMOS transistor susceptible to aging (e.g., aging PMOS transistor 106A and aging PMOS transistor 108A) and a PMOS transistor not susceptible to aging (e.g., non-aging PMOS transistor 106B and non-aging PMOS transistor 108B). In one aspect, the "aging" of a transistor may refer to the tendency of a MOS transistor's threshold voltage $V_T$ to change over time. For example, referring to FIG. 1A, when a logic "1" (e.g., VDD) is stored at node 120, the gate of aging PMOS transistor 106A will be low, turning aging PMOS transistor 106A on. While aging PMOS transistor 106A is on and node 120 is at a logic "1", both the drain and source of aging PMOS transistor 106A are high, which may cause a negative bias across the gate oxide of aging PMOS transistor 106A. This negative bias across the gate oxide of aging PMOS transistor 106A causes stress on the device, which may result in a change (i.e., increase) in the threshold voltage of aging PMOS transistor 106A the longer the stress is present. Such a stress on a PMOS transistor due to a negative bias across the gate oxide may be referred to as Negative Bias Temperature Instability (NBTI).

The NMOS transistors of SRAM 100 may similarly be subject to stress which causes their respective threshold voltages $V_T$ to change over time. For example, referring to FIG. 1A, when a logic "0" (e.g., ground) is stored at node 130, the gate of aging NMOS transistor 107A will be high, turning aging NMOS transistor 107A on. While aging NMOS transistor 107A is on and node 130 is at a logic "0", both the drain and source of aging NMOS transistor 107A are low, which may cause a positive bias across the gate oxide of aging NMOS transistor 107A. This positive bias across the gate oxide of aging NMOS transistor 107A causes stress on the device, which may result in a change (i.e., increase) in the threshold voltage of aging NMOS transistor 107A the longer the stress is present. Such a stress on an NMOS transistor due to a positive bias across the gate oxide may be referred to as Positive Bias Temperature Instability (PBTI).

Thus, PMOS transistors that hold a "1" state in the bitcells 102 and 104 will be aged due to Negative Bias Temperature Instability (NBTI), while the PMOS transistor that holds a "0" will remain unstressed.

Accordingly, embodiments discussed herein include determining an amount of aging associated with an aging transistor in an SRAM. In response to determining that one or more of the aging transistors has in fact aged, voltage adjustment module 116 may dynamically adjust the supply voltage (i.e., operating voltage or $V_{DD}$) of the SRAM 100. Alternatively, or in addition, a frequency adjustment module 128 dynamically adjusts the frequency of operation (i.e., clock frequency) of the SRAM 100 in response to determining that one or more of the aging transistors has aged.

As discussed above, $V_{DDMIN}$ may refer to the lowest voltage at which an SRAM bitcell can be reliably read from or written to for a given time. That is, $V_{DDMIN}$ is the voltage just above the voltage at which the first SRAM bitcell begins to fail. However, as the threshold voltages of one or more of the transistors included in the bitcells increases, so too does $VDD_{MIN}$. Thus, voltage adjustment module 116 may increase $V_{DD}$ to account for the increasing $V_{DDMIN}$ due to aging of one of more transistors in the bitcells.

Some foundries create SRAM bitcells with a conservative flat guard band to account for an expected increase in $V_{DDMIN}$ due to aging in the SRAM transistors. That is, $V_{DD}$ may be initially set higher than necessary in anticipation of a need for a higher $V_{DD}$ in the future as the SRAM ages. Thus, in one or more implementations, the supply voltage (i.e., operating voltage or $V_{DD}$) of a SRAM is lowered to a $VDD_{MIN}$ at time zero (e.g., when the SRAM is placed into service) to recover at least some of the default guard band provided by the foundry. Thus, during operation of the SRAM, voltage adjustment module 116 may increase $V_{DD}$, as needed, to compensate for an increasing $V_{DDMIN}$ depending on the output of the aging sensor 110. In still another implementation, the supply voltage (i.e., operating voltage or $V_{DD}$) remains the same; however, the frequency of operation (i.e., clock frequency) of the SRAM is reduced over time based on the output of the aging sensor.

To illustrate one implementation, suppose that $V_{DD}$ is initially set to 700 millivolts. As time progresses, the transistors in the bitcells age such that the $V_{DDMIN}$ is greater than 700 millivolts. In particular, let us suppose that the $V_{DDMIN}$ has increased to 750 millivolts. In one or more implementation, the aging sensor detects the aging of one or more transistors and then the voltage adjustment module 116 may increase $V_{DD}$ for the SRAM from 700 millivolts to 750 millivolts. With the increase in $V_{DD}$, the SRAM will continue to operate reliably. Alternatively, or in addition thereto, the frequency adjustment module 128 may reduce the operating frequency for the SRAM (e.g., from 350 MHz to 250 MHz), and the SRAM will continue to operate reliably.

In one aspect, the amount of aging is determined by performing one or more write and/or read operations on the bitcells and observing the voltages and/or currents associated with both an aging transistor of one bitcell and a corresponding non-aging transistor of another bitcell, where both bitcells are configured to store the same data throughout normal memory operations.

Figure 1B:
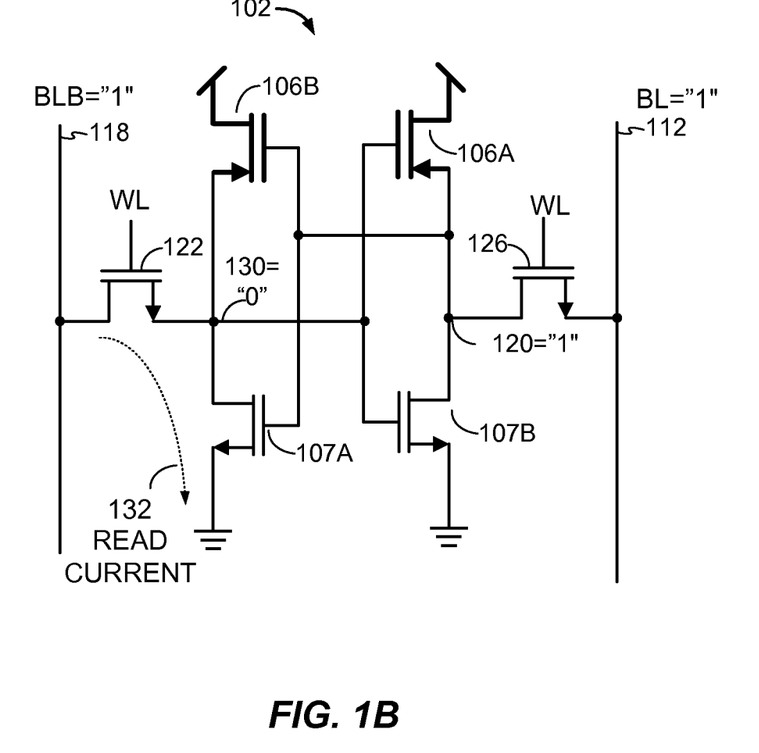
FIG. 1B illustrates a read operation of a bitcell and an associated read current through an aging transistor, according to one or more implementations of the technology described herein.

For instance, FIG. 1B illustrates a read operation of a bitcell 104 and an associated read current 132 through an aging NMOS transistor 107A, according to one or more implementations of the technology described herein. As shown in FIG. 1B, bitcell 102 is provided that is currently storing a logic "1". Thus, node 120 is at a logic "1" (e.g., $V_{DD}$), while node 130 is at a logic "0" (e.g., zero volts or ground). The read operation may be performed by setting both bitlines 112 and complementary bitline 118 to a logic "1" (e.g., $V_{DD}$) and then activating the wordline WL of transistors 122 and 126. With node 120 at a logic "1", the gate of aging NMOS transistor 107A is also high, thus turning NMOS transistor 107A on. With both the drain and source of aging NMOS transistor 107A low, the gate of aging NMOS transistor at a logic "1", and complementary bitline 118 at a logic "1", a read current 132 is then allowed to flow from bitline 118 through transistor 122 and through aging NMOS transistor 107A. In one aspect, the magnitude of read current 132 is representative of the threshold voltage of aging NMOS transistor 107A. Accordingly, an aging sensor, such as aging sensor 110, that is coupled to complementary bitline 118 may compare the read current 132 with the read current of a non-aging NMOS transistor of a corresponding bitcell in order to determine the relative aging of aging NMOS transistor 107A.

Figure 1C:
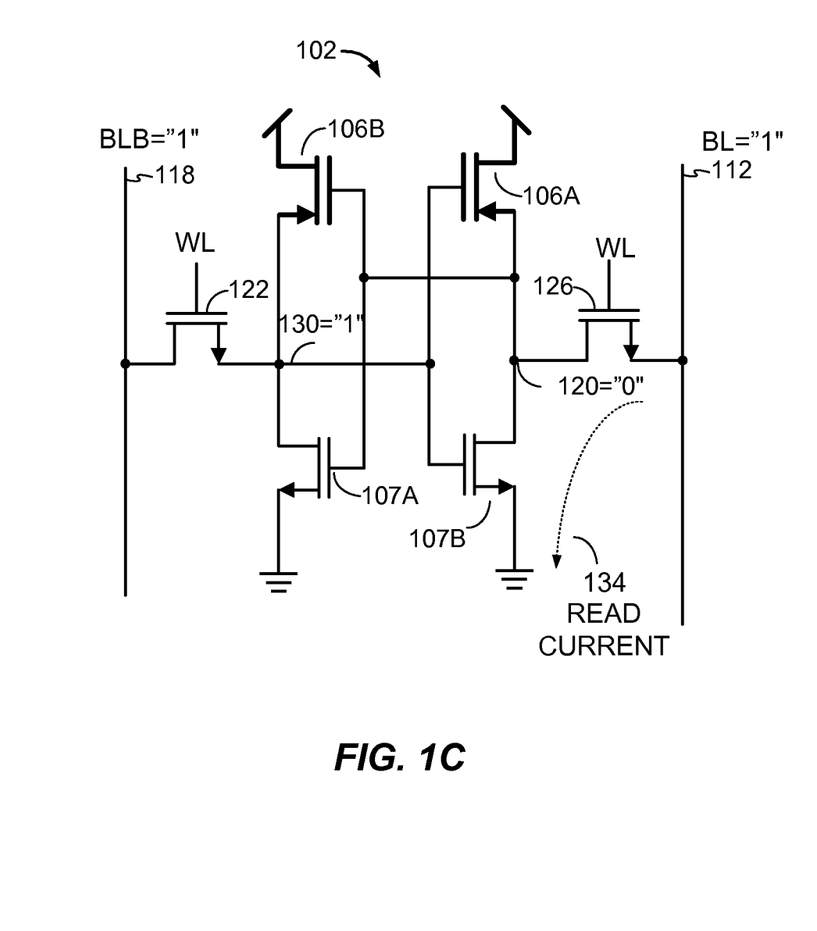
FIG. 1C illustrates a read operation of a bitcell and an associated read current through a non-aging transistor, according to one or more implementations of the technology described herein.

FIG. 1C illustrates a read operation of a bitcell 102 and an associated read current 134 through a non-aging NMOS transistor 107B, according to one or more implementations of the technology described herein. As shown in FIG. 1B, bitcell 102 is provided that is currently storing a logic "0". Thus, node 120 is at a logic "0" (e.g., zero volts or ground), while node 130 is at a logic "1" (e.g., $V_{DD}$). The read operation may be performed by setting both bitline 112 and complementary bitline 118 to a logic "1" (e.g., $V_{DD}$) and then activating the wordline WL of transistors 122 and 126. With node 120 at a logic "0", the gate of non-aging NMOS transistor 107B is also high, thus turning NMOS transistor 107B on. With both the drain and source of non-aging NMOS transistor 107B low, the gate of non-aging NMOS transistor 107B at a logic "1", and bitline 112 at a logic "1", a read current 134 is then allowed to flow from bitline 112 through transistor 126 and through non-aging NMOS transistor 107B. In one aspect, the magnitude of read current 134 is representative of the threshold voltage of non-aging NMOS transistor 107B. Accordingly, an aging sensor, such as aging sensor 110, that is coupled to bitline 112 may compare the read current 134 with the read current of an aging NMOS transistor of a corresponding bitcell in order to determine the relative aging of the aging NMOS transistor. For example, the read current through non-aging NMOS transistor 107B may be compared with the read current through aging NMOS transistor 109A, of FIG. 1A is order to determine the aging of aging NMOS transistor 109A.

Figure 1D:
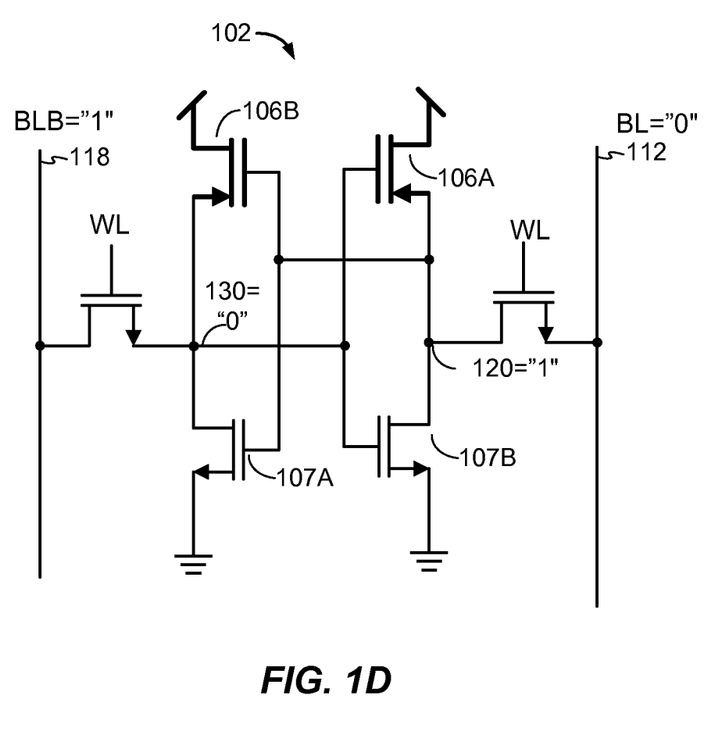
FIGS. 1D and 1E illustrate a full-write operation of a bitcell, according to one or more implementations of the technology described herein.
Figure 1E:
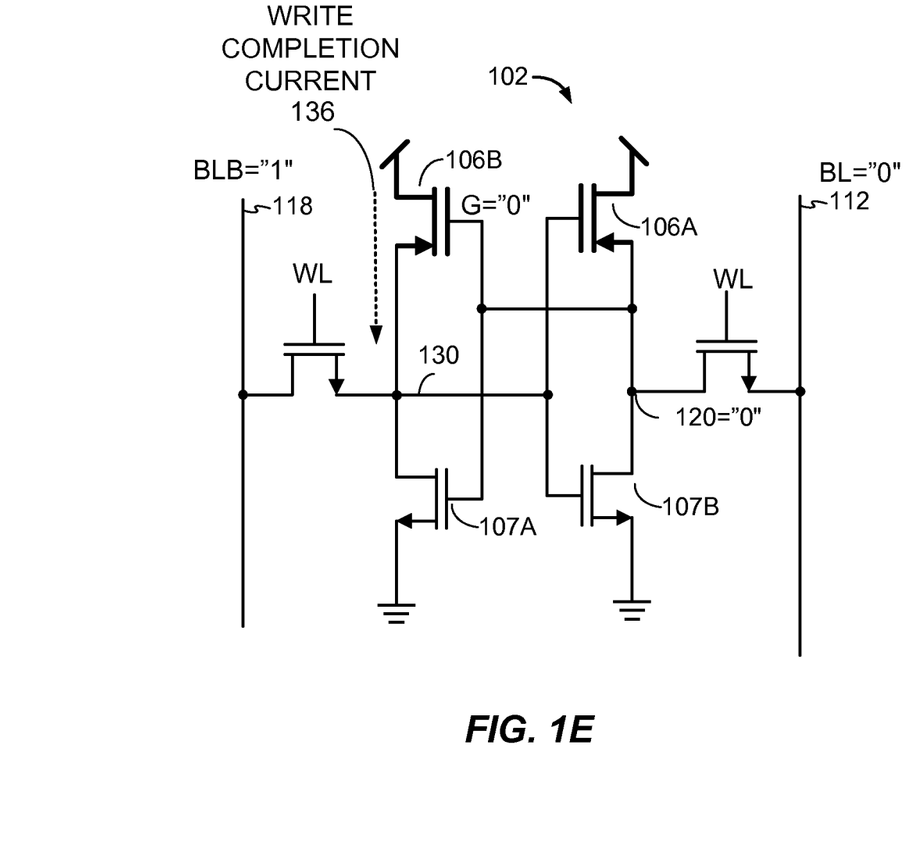

FIGS. 1D and 1E illustrate a full-write operation of a bitcell 102, according to one or more implementations of the technology described herein. As shown in FIG. 1D, bitcell 102 is provided that is currently storing a logic "1". Thus, node 120 is at a logic "1" (e.g., $V_{DD}$), while node 130 is at a logic "0" (e.g., zero volts or ground). The full-write operation may be performed by setting one bitline to a logic "1" and the other bitline to a logic "0". For example, FIG. 1D illustrates the writing of a logic "0" to bitcell 102 by setting bitline 112 to logic "0" and complementary bitline 118 to a logic "1". As shown in FIG. 1E, the wordlines WL of transistors 122 and 126 are then activated which causes the node 120 to change to a logic "0" and node 130 to change to a logic "1". With node 120 at a logic "0", the gate of non-aging PMOS transistor 106B is also low, thus turning non-aging PMOS transistor 106B on. With the gate of non-aging PMOS transistor 106B at a logic "0", a write completion current 136 is then allowed to flow through non-aging PMOS transistor 106B. In one aspect, the magnitude of write completion current 136 is representative of the threshold voltage of non-aging PMOS transistor 106B. However, write completion current 136 is a signal internal to bitcell 102. That is, with complementary bitline 118 set to a logic "1", write completion current 136 is not allowed to flow onto complementary bitline 118. Accordingly, embodiments of the present disclosure may include an additional half-write operation in order to allow at least a portion of the write completion current 136 to flow onto a bitline so that it may be measured or otherwise detected by aging sensor 110.

Figure 1F:
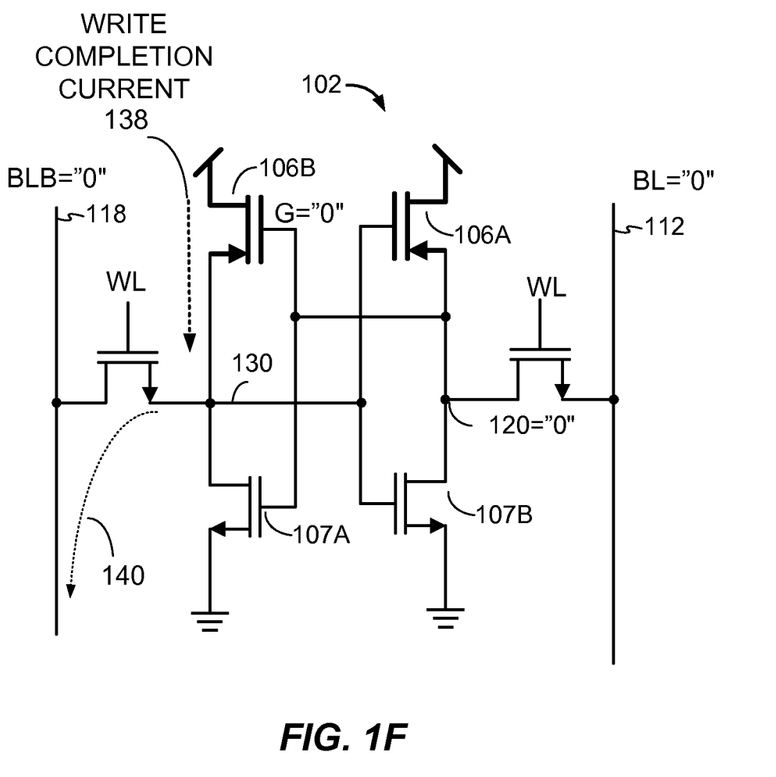
FIG. 1F illustrates a half-write operation of a bitcell and associated write completion currents associated with a non-aging transistor, according to one or more implementations of the technology described herein.

For example, FIG. 1F illustrates a half-write operation of bitcell 102 and associated write completion currents 138 and 140 associated with non-aging PMOS transistor 106B, according to one or more implementations of the technology described herein. The example, of FIG. 1F is similar to the full-write operation of FIG. 1E above with the bitline 122 set to a logic "0" in order to write a logic "0" to bitcell 102. However, the half-write operation of FIG. 1F includes setting both bitlines to a logic "0". That is complementary bitline 118 is also set to a logic "0". Thus, with the gate of non-aging PMOS transistor 106B low and complementary bitline 118 at a logic "0", at least a portion 140 of write completion current 138 is allowed to flow through to complementary bitline 118. In one aspect, the magnitude of the portion 140 of write completion current 138 is representative of the threshold voltage of non-aging PMOS transistor 106B. Accordingly, an aging sensor, such as aging sensor 110, that is coupled to complementary bitline 118 may compare the portion 140 of the write completion current 138 with the write completion current of an aging PMOS transistor of a corresponding bitcell in order to determine the relative aging of the aging PMOS transistor.

As will be described in more detail, in at least one implementation, a full-write operation of writing a logic "0" to node 130 is performed prior to the half-write operation in order to read out the portion 140 of write completion current 138 to complementary bitline 118.

Figure 1G:
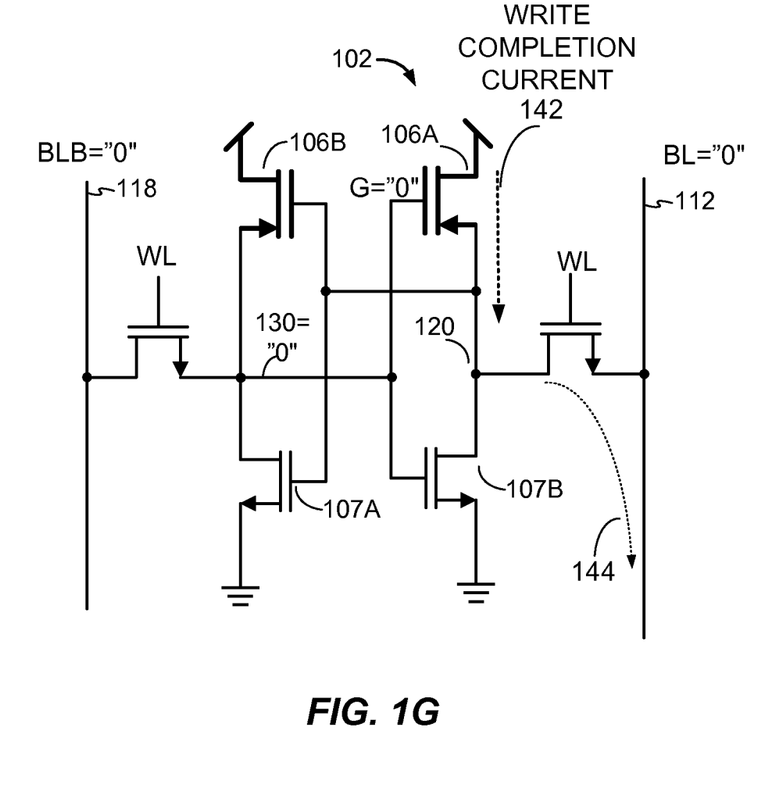
FIG. 1G illustrates a half-write operation of a bitcell and associated write completion currents associated with an aging transistor, according to one or more implementations of the technology described herein.

FIG. 1G illustrates a half-write operation of a bitcell 102 and associated write completion currents 142 and 144 associated with an aging PMOS transistor 106A, according to one or more implementations of the technology described herein. The example, of FIG. 1G is similar to the half-write operation of FIG. 1F above with both bitlines 118 and 122 set to a logic "0". However, the half-write operation of FIG. 1G includes node 130 set to a logic "0". Thus, with the gate of aging PMOS transistor 106A low, and complementary bitline 118 at a logic "0", at least a portion 144 of write completion current 142 is allowed to flow through to bitline 112. In one aspect, the magnitude of the portion 144 of write completion current 142 is representative of the threshold voltage of aging PMOS transistor 106A. Accordingly, an aging sensor, such as aging sensor 110, that is coupled to bitline 112 may compare the portion 144 of write completion current 142 with a portion of a write completion current of a non-aging PMOS transistor of a corresponding bitcell in order to determine the relative aging of the aging PMOS transistor 106A. For example, the portion 144 of write completion current 142 may be compared with a portion of the write completion current through non-aging PMOS transistor 108B, of FIG. 1A is order to determine the aging of aging PMOS transistor 106A. As will be described in more detail, in at least one implementation, a full-write operation of writing a logic "0" to node 120 is performed prior to the half-write operation in order to read out the portion 144 of write completion current 142 to bitline 112.

Figure 2:
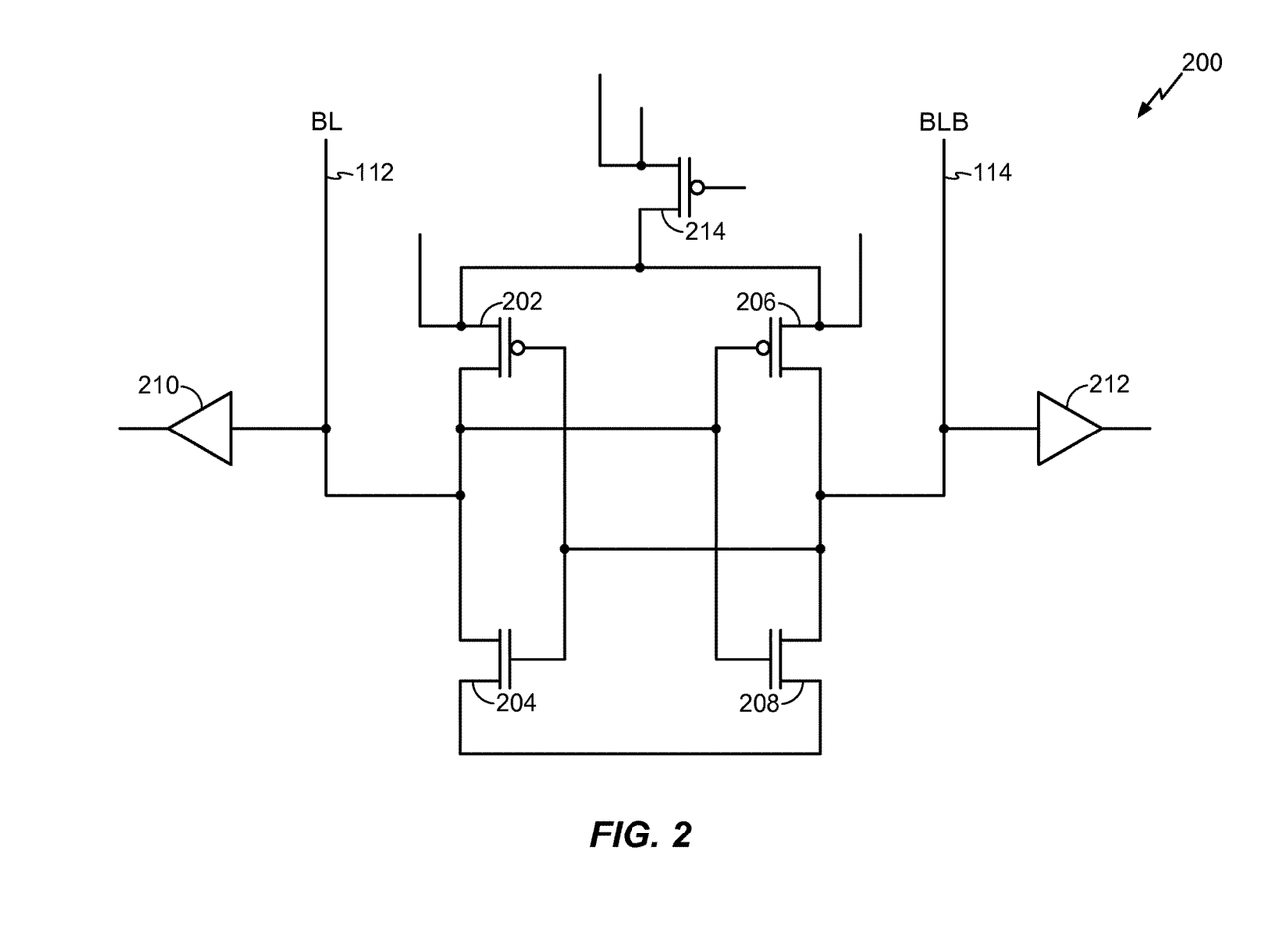
FIG. 2 is a schematic diagram of a voltage aging sensor according to one or more implementations of the technology described herein.

FIG. 2 is a schematic diagram of a voltage aging sensor 200 according to one or more implementations of the technology described herein. The aging sensor 110 may implement the voltage aging sensor 200. The illustrated voltage aging sensor 200 includes a PMOS transistor 202, an NMOS transistor 204, a PMOS transistor 206, and an NMOS transistor 208 coupled as illustrated. The illustrated voltage aging sensor 200 also includes an isolation gate 210, an isolation gate 212, and a PMOS transistor 214 coupled as illustrated. The voltage aging sensor 200 may be fabricated by coupling the components as illustrated in FIG. 2.

The voltage aging sensor 200 operation is described with reference to FIG. 1A for the determination of aging of aging PMOS transistor 106A. In the illustrated implementation, full-write operations, such as described above with reference to FIGS. 1D and 1E, of writing a logic "0" to node 120 of bitcell 102 and also of writing a logic "0" to node 131 of bitcell 104 are first performed. Next, bitline 112 and complementary bitline 114 are left floating (i.e., neither connected to ground nor to $V_{DD}$). Then a half-write operation, such as described above with reference to FIGS. 1E and 1F, are performed by half-writing a logic "0" to node 120 of bitcell 102 and by half-writing a logic "0" to node 131 of bitcell 104. Because the write completion currents between the aging PMOS transistor 106A and the non-aging PMOS transistor 108B are different due to aging, the aging PMOS transistor 106A and the non-aging PMOS transistor 108B will pull up the voltage on their respective bitlines 112 and 114 at different rates. That is, the rate at which the voltage changes on a bitline during a half-write operation is dependent, in part, on the aging of the PMOS transistor of their respective bitcell. Accordingly, voltage aging sensor 200 includes isolation gate 210 that generates a signal representative of the voltage on bitline 112 that changes with respect to time during the half-write operation. Similarly, isolation gate 212 generates a signal that is representative of the voltage on complementary bitline 114 that changes with respect to time. Thus, the signal output by isolation gate 210 may be compared with the signal output by isolation gate 212 in order to determine a difference in the rate at which the voltage changes on bitline 112 with respect to the rate at which the voltage changes on complementary bitline 114. This difference in rates may be representative of the aging of aging PMOS transistor 106A.

Figure 3:
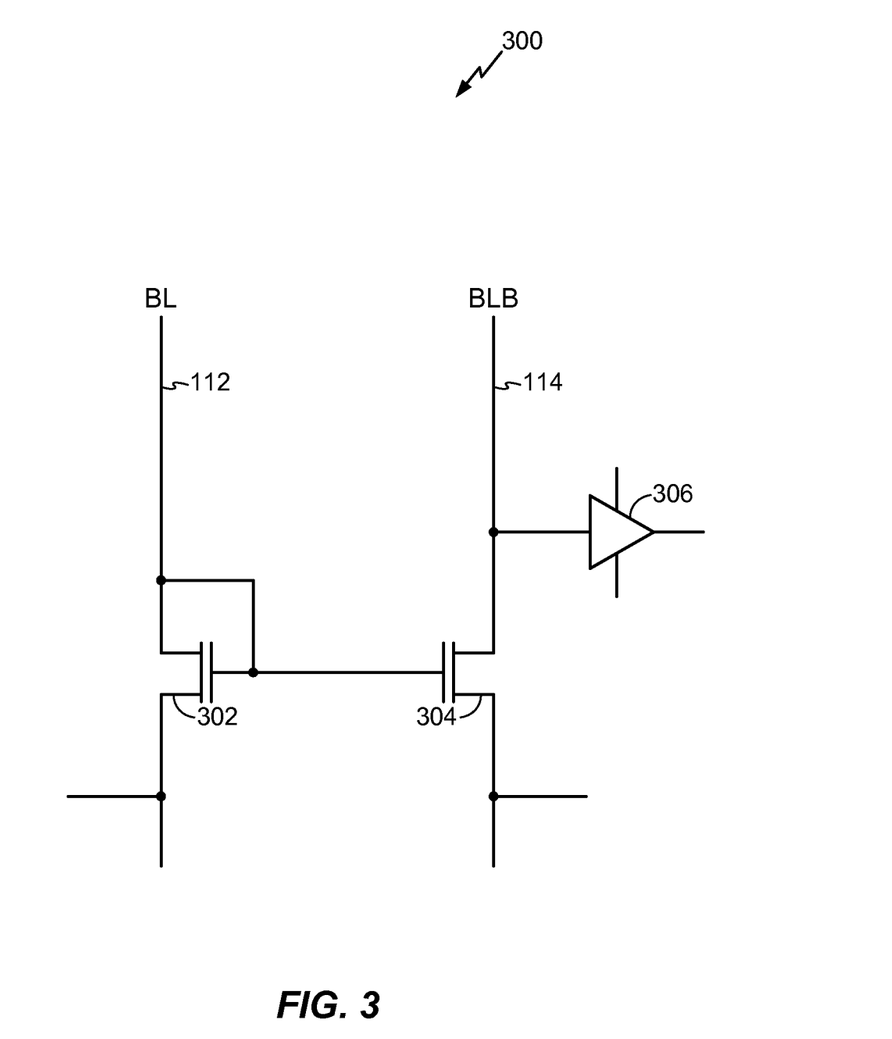
FIG. 3 is a schematic diagram of a current mirror aging sensor according to one or more implementations of the technology described herein.

FIG. 3 is a schematic diagram of a single-stage current mirror aging sensor 300 according to one or more implementations of the technology described herein. Current mirror aging sensor 300 is one possible implementation of aging sensor 110 of FIG. 1A. The illustrated current mirror aging sensor 300 includes an NMOS transistor 302, an NMOS transistor 304, and an isolation gate 306. The current mirror aging sensor 300 may be fabricated by coupling the components as illustrated in FIG. 3.

The current mirror aging sensor 300 operation is described with reference to FIG. 1A for the determination of the aging of aging PMOS transistor 106A. In the illustrated implementation, full-write operations, such as described above with reference to FIGS. 1D and 1E, of writing a logic "0" to node 120 of bitcell 102 and also of writing a logic "0" to node 131 of bitcell 104 are first performed. Next, a half-write operation, such as described above with reference to FIGS. 1E and 1F, are performed by half-writing a logic "0" to node 120 of bitcell 102 and by half-writing a logic "0" to node 131 of bitcell 104. Because the write completion currents between the aging PMOS transistor 106A and the non-aging PMOS transistor 108B are different due to aging, the portions of the respective write completion currents output onto the bitlines will be different. That is, the portion of the write completion current output onto bitline 112 during a half-write operation to node 120 is different than the portion of the write completion current output onto bitline 114 during the half-write operation to node 131. Accordingly, current mirror aging sensor 300 includes isolation gate 306 that generates a signal representative of a difference between the current on bitline 112 and the current on bitline 114. Thus, the signal output by isolation gate 306 may be representative of the aging of aging PMOS transistor 106A.

Figure 4:
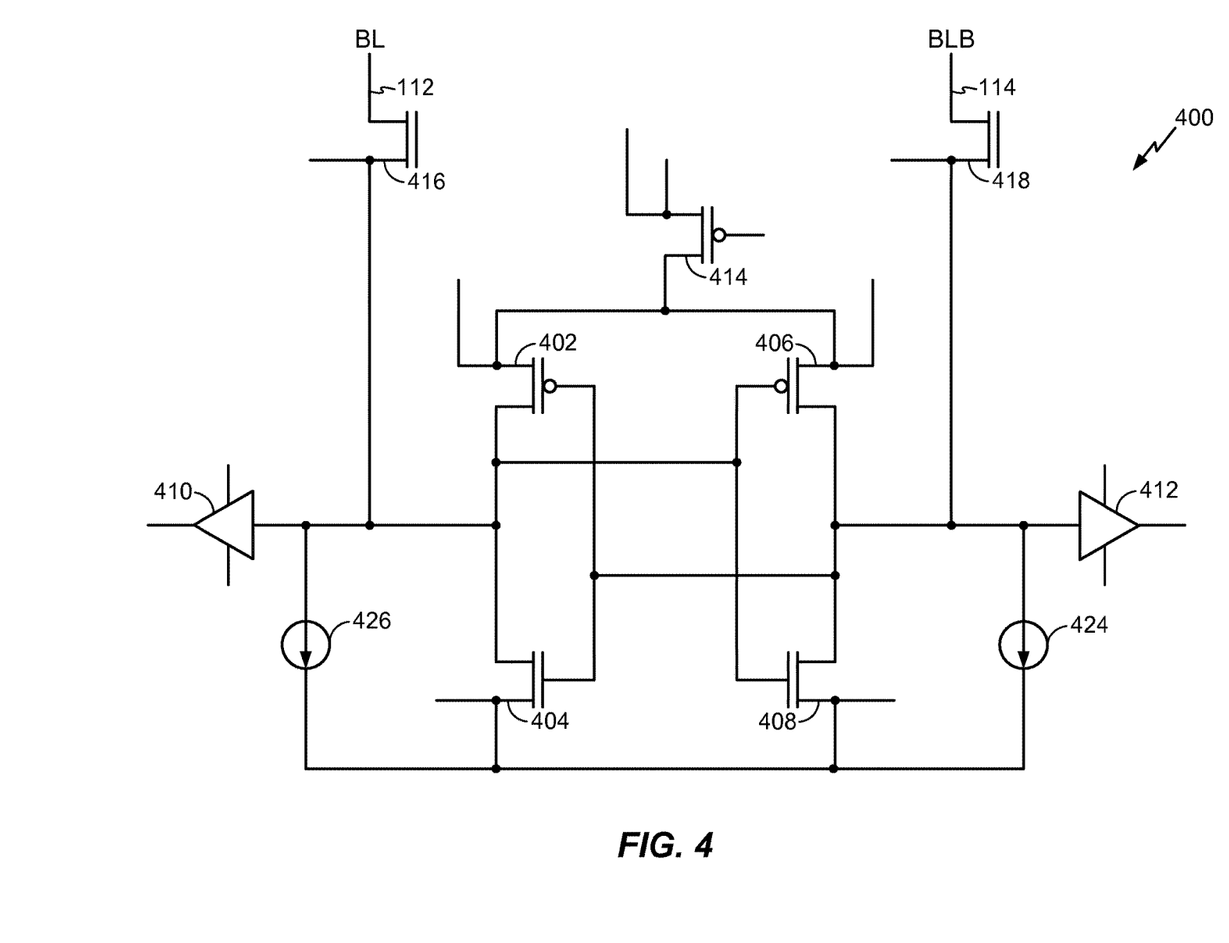
FIG. 4 is a schematic diagram of a two-stage current aging sensor according to one or more implementations of the technology described herein.

FIG. 4 is a schematic diagram of a two-stage current mirror aging sensor 400 according to one or more implementations of the technology described herein. The illustrated current aging sensor 400 includes a PMOS transistor 402, an NMOS transistor 404, a PMOS transistor 406, and an NMOS transistor 408, an isolation gate/latch 410, an isolation gate/latch 412, a PMOS transistor 414, an NMOS transistor 416, an NMOS transistor 418, a current source 424, and a current source 426, coupled as illustrated. Current mirror aging sensor 400 is one possible implementation of aging sensor 110 of FIG. 1A.

Two-stage current mirror aging sensor 400 operates similar to voltage aging sensor 200 of FIG. 2, described above. However, two-stage current mirror aging sensor 400 includes current source 426 coupled to provide a current on bitline 112 during the half-write operation and a current source 424 is coupled to provide a current on complementary bitline 114, also during the half-write operation. The current provided by current source 426 may be the same as the current provided by current source 424. In this manner, the same current will be forced through both the bit line BL 112 as through the complementary bit line BLB 114, while the bitlines are floating. The difference in aging between the aging PMOS transistor 106A and the non-aging PMOS transistor 108B will cause the voltages of the bit line BL 112 and the complementary bit line BLB 114 to settle at different voltages. For example, the voltage on one bitline may settle at $V_{DD}$ by pulling up the bitline, while the other bitline may settle at zero Volts by pulling down the bitline. Thus, the signal output by isolation gate 410 may be compared with the signal output by isolation gate 412 in order to determine a difference in the time at which the voltage on bitline 112 settles with respect to the time at which the voltage on complementary bitline 114 settles. This difference in time of settling may be representative of the aging of aging PMOS transistor 106A.

Figure 5:
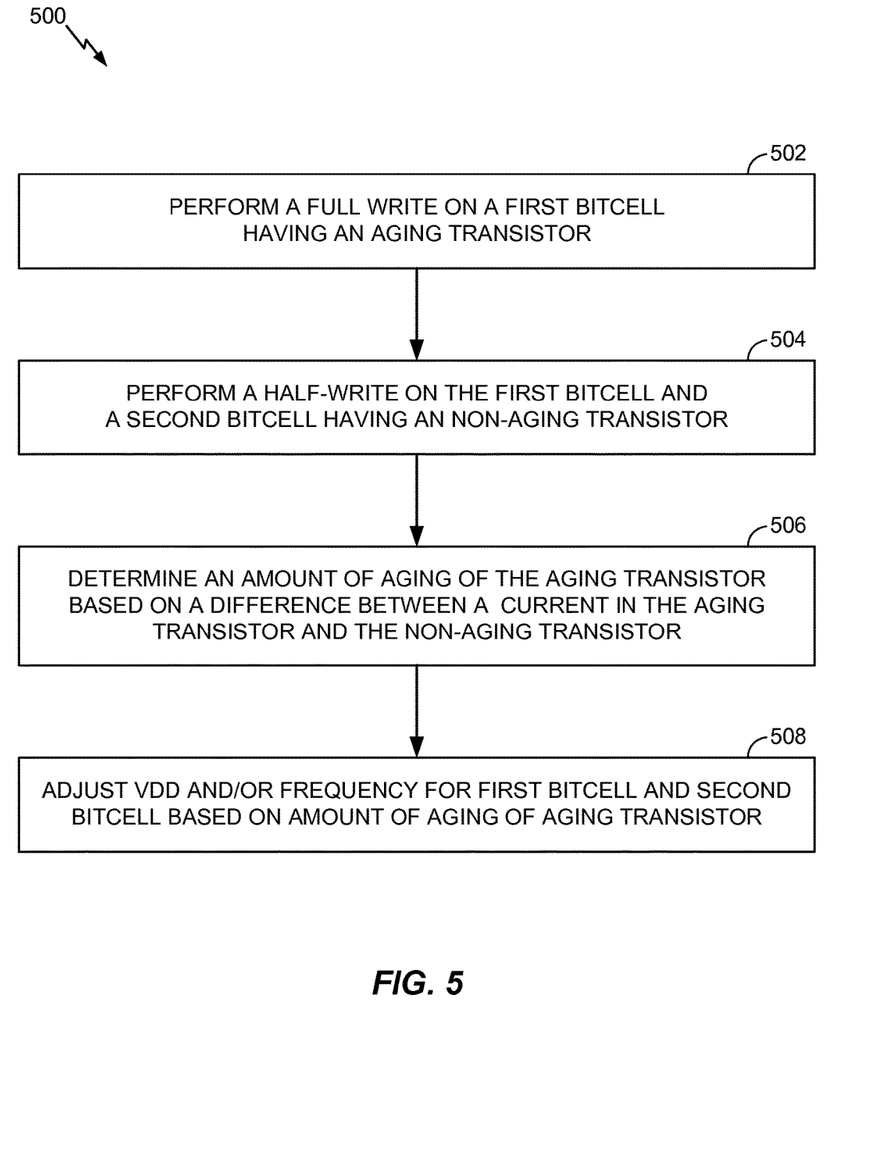
FIG. 5 is a flowchart of a method of sensing aging in a static random-access memory (SRAM) array according to one or more implementations of the technology described herein.

FIG. 5 is a flowchart of a method 500 of sensing aging in a SRAM according to one or more implementations of the technology described herein.

In a block 502, the method 500 performs a full-write operation on a first bitcell having an aging transistor. In one or more implementations, a full write operation is performed as described above with reference to FIGS. 1D and 1E.

In a block 504, the method 500 performs a half-write operation on the first bitcell and on second bitcell that is configured to store the same data during normal operation as the first bitcell. In one or more implementations, a half-write operation is performed as described above with reference to FIGS. 1F and/or 1G. The method 500 obtains a voltage and/or current from the aging transistor and from the non-aging transistor.

In a block 506, the method 500 determines an amount of aging in the aging transistor based on a difference between a current (e.g., read current and/or write completion current) in the aging transistor and a current in the non-aging transistor. In one or more implementations, the result of the full-write and the half-write operations is that the current corresponding to the aging PMOS transistor 106A appears on the bitline BL 112 and the current corresponding to the non-aging PMOS transistor 108 appears on the complementary bitline BLB 114. The sensors 200, 300, and/or 400 sense and compare the current and/or voltage corresponding to the aging PMOS transistor 106A appearing on the bitline BL 112 and the current corresponding to the non-aging PMOS transistor 108B appearing on the complementary bitline BLB 114. The difference between a current in the aging PMOS transistor 106A and a current in the non-aging PMOS transistor 108B determines the amount of aging in the aging PMOS transistor 106.

In a block 508, the method 500 adjusts $V_{DD}$ and/or the clock frequency for the SRAM based on the comparison of the voltage and/or current from the aging transistor and the voltage and/or current from the non-aging transistor. In one or more implementations, the $V_{DD}$ adjustment module 116 adjusts $V_{DD}$ for the bitcell 102 and the bitcell 104 based on the comparison of the voltage and/or current from the aging transistor 106A and the non-aging transistor 108B. In alternative implementations, the frequency adjustment module 128 adjusts the clock frequency for the bitcell 102 and the bitcell 104 based on the comparison of the voltage and/or current from the aging transistor 106A and the non-aging transistor 108B. Similarly, read operations, such as those described above with reference to FIGS. 1B and 1C may be performed in order to compare the read current of aging NMOS 109A with the current of non-aging NMOS 107B in order to determine the aging of aging NMOS 109A.

Figure 6:
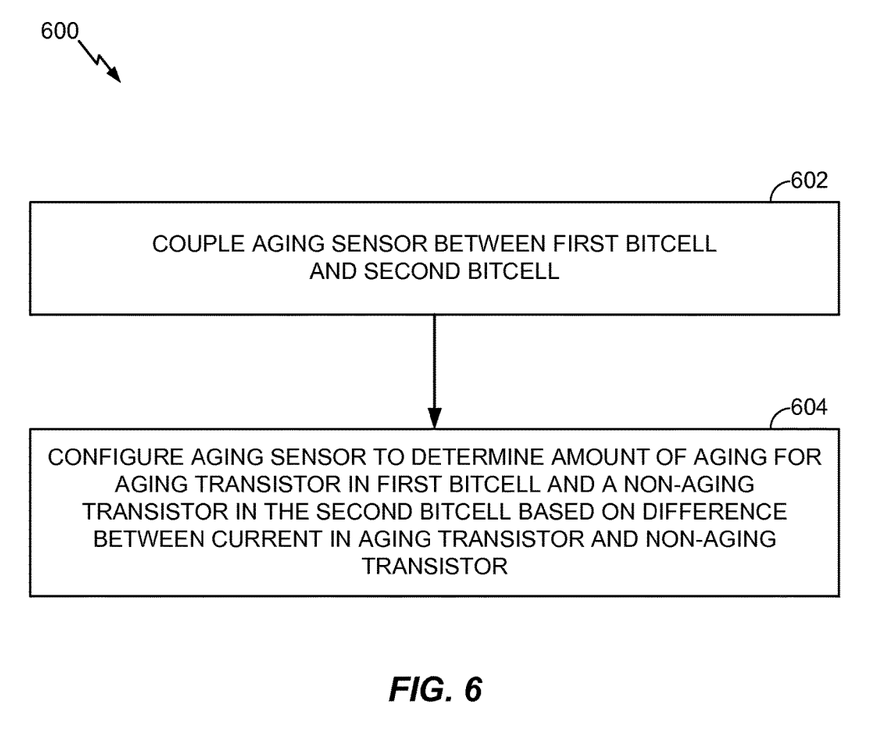
FIG. 6 is a flowchart of a method for fabricating a static random-access memory (SRAM) according to one or more implementations of the technology described herein.

FIG. 6 is a flowchart of a method 600 of fabricating a SRAM according to one or more implementations of the technology described herein. Fabrication of the SRAM may be implemented using known integrated circuit (IC) techniques, such as deposition, etching, chemical-mechanical planarization (CMP), cleaning, etc.

In a block 602, the method 600 couples an aging sensor between a first bitcell in the SRAM array and a second bitcell in the SRAM array. In one or more implementations, the aging sensor 110 is coupled between the bitcell 102 and the bitcell 104.

In a block 604, the method 600 configures the aging sensor to determine an amount of aging for an aging transistor in the first bitcell and non-aging transistor in the second bitcell based on a difference between a current in the aging transistor and a current in the non-aging transistor. In one or more implementations, the aging sensor 110 is configured to determine an amount of aging for the aging PMOS transistor 106A in the bitcell 102 and the non-aging PMOS transistor 108B in the bitcell 104 based on a difference between a current in the aging PMOS transistor 106A and a current in the non-aging PMOS transistor 108B.

Aspects of the technology described herein are disclosed in the following description and related drawings directed to specific implementations of the technology described herein. Alternative implementations may be devised without departing from the scope of the technology described herein. Additionally, well-known elements of the technology described herein will not be described in detail or will be omitted so as not to obscure the relevant details of the technology described herein.

The term "implementations of the technology described herein" does not require that all implementations of the technology described herein include the discussed feature, advantage, or mode of operation.

The terminology used herein is for the purpose of describing particular implementations only and is not intended to be limiting of implementations of the technology described herein. As used herein, the singular forms "a," "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many implementations are described in terms of sequences of actions to be performed by, for example, elements of a computing device. It will be recognized that various actions described herein can be performed by specific circuits (e.g., application specific ICs (ASICs)), by program instructions being executed by one or more processors, or by a combination of both. Additionally, these sequence of actions described herein can be considered to be embodied entirely within any form of computer-readable storage medium having stored therein a corresponding set of computer instructions that upon execution would cause an associated processor to perform the functionality described herein. Thus, the various aspects of the technology described herein may be embodied in a number of different forms, all of which have been contemplated to be within the scope of the claimed subject matter. In addition, for each of the implementations described herein, the corresponding form of any such implementations may be described herein as, for example, "logic configured to" perform the described action.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the implementations disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present technology described herein.

The methods, sequences, and/or algorithms described in connection with the implementations disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an implementation of the technology described herein can include a computer-readable media embodying a method of fabricating a semiconductor device. Accordingly, the technology described herein is not limited to illustrated examples, and any means for performing the functionality described herein are included in implementations of the technology described herein.

While the foregoing disclosure shows illustrative implementations of the technology described herein, it should be noted that various changes and modifications could be made herein without departing from the scope of the technology described herein as defined by the appended claims. The functions, steps, and/or actions of the method claims in accordance with the implementations of the technology described herein described herein need not be performed in any particular order. Furthermore, although elements of the technology described herein may be described or claimed in the singular, the plural is contemplated unless limitation to the singular is explicitly stated.

What is claimed is:

1. A static random-access memory (SRAM) array, comprising:
   a first bitcell having an aging transistor;
   a second bitcell having a non-aging transistor; and
   an aging sensor coupled between the first bitcell and the second bitcell, wherein the aging sensor is configured to determine an amount of aging associated with the aging transistor based on a difference between a voltage or a current associated with the aging transistor and a voltage or a current associated with the non-aging transistor.

2. The static random-access memory (SRAM) array of claim 1, wherein the aging sensor includes a voltage aging sensor configured to determine a voltage difference between a bitline and a complementary bitline.

3. The static random-access memory (SRAM) array of claim 2, wherein the voltage aging sensor includes a first isolation gate coupled to a first bitline of the first bitcell and a second isolation gate coupled to a second bitline of the second bitcell, the first isolation gate configured to generate a first signal representative of a first rate at which a voltage changes on the first bitline and wherein the second isolation gate is configured to generate a second signal representative of a second rate at which a voltage changes on the second bitline, wherein a difference between the first rate and the second rate is representative of the aging of the aging transistor.

4. The static random-access memory (SRAM) array of claim 1, wherein the aging sensor includes a current mirror aging sensor coupled to a first bitline of the first bitcell and to a second bitline of the second bitcell, wherein the current mirror aging sensor is configured to determine a difference between a first current on the first bitline and a second current on the second bitline, wherein the difference between the first current and the second current is representative of the aging of the aging transistor.

5. The static random-access memory (SRAM) array of claim 1, wherein the aging sensor includes a two-stage current mirror aging sensor coupled to a first bitline of the first bitcell and to a second bitline of the second bitcell, wherein the two-stage current mirror aging sensor is configured to determine a difference in a first time at which a voltage on the first bitline settles and a second time at which a voltage on the second bitline settles, wherein the difference between the first time and the second time is representative of the aging of the aging transistor.

6. The static random-access memory (SRAM) array of claim 1, further comprising a voltage adjustment module configured to set a supply voltage $V_{DD}$ associated with the first and second bitcells to a first value, wherein the aging sensor is further configured to determine that a minimum supply voltage $V_{DDMIN}$ associated with the first and second bitcells has increased, and wherein the voltage adjustment module is further configured to increase the $V_{DD}$ to a second value greater than the first value based on the determination that the $V_{DDMIN}$ associated with the first and second bitcells has increased.

7. The static random-access memory (SRAM) array of claim 1, further comprising a frequency adjustment module configured to set a clock frequency associated with the first and second bitcells to a first value, wherein the aging sensor is further configured to determine that a minimum supply voltage $V_{DDMIN}$ associated with the first and second bitcells has increased, and wherein the frequency adjustment module is further configured to decrease the clock frequency to a second value less than the first value based on the determination that the $V_{DDMIN}$ associated with the first and second bitcells has increased.

8. The static random-access memory (SRAM) array of claim 1, wherein the first bitcell is configured to store the same data as the second bitcell during normal memory operations of the SRAM array.

9. The static random-access memory (SRAM) array of claim 1, wherein the aging transistor of the first bitcell is an aging p-channel metal oxide semiconductor (PMOS) transistor and wherein the non-aging transistor of the second bitcell is a non-aging PMOS transistor.

10. The static random-access memory (SRAM) array of claim 1, wherein the aging transistor of the first bitcell is an aging n-channel metal oxide semiconductor (NMOS) transistor and wherein the non-aging transistor of the second bitcell is a non-aging NMOS transistor.

11. A method of fabricating a static random-access memory (SRAM) array, comprising:
coupling an aging sensor between a first bitcell in the SRAM array and a second bitcell in the SRAM array; and
configuring the aging sensor to determine an amount of aging for an aging transistor in the first bitcell and a non-aging transistor in the second bitcell based on a difference between a current associated with the aging transistor and a current associated with the non-aging transistor.

12. The method of claim 11, further comprising:
coupling the first bitcell to a bitline;
coupling the second bitcell to a complementary bitline; and
coupling the aging sensor to the bitline and to the complementary bitline to determine a voltage difference between the bitline and the complementary bitline.

13. The method of claim 12, further comprising coupling a voltage aging sensor coupled to the bitline and to the complementary bitline to determine the voltage difference between the bitline and the complementary bitline.

14. The method of claim 11, further comprising:
coupling the first bitcell to a bitline;
coupling the second bitcell to a complementary bitline; and
coupling a current mirror aging sensor to the bitline and to the complementary bitline to determine a current difference between the bitline and the complementary bitline.

15. The method of claim 11, further comprising:
coupling the first bitcell to a bitline;
coupling the second bitcell to a complementary bitline; and
coupling a two-stage current mirror aging sensor to the bitline and to the complementary bitline to determine a difference between a first time that a voltage on the bitline settles and a second time that a voltage on the complementary bitline settles.

16. The method of claim 11, further comprising:
coupling a voltage adjustment module to the first and second bitcells; and
configuring the voltage adjustment module to:
set a supply voltage $V_{DD}$ associated with the first and second bitcells to a first value;
determine that a minimum supply voltage $V_{DDMIN}$ associated with the first and second bitcells has increased; and
set the $V_{DD}$ associated with the first and second bitcells to a second value greater than the first value based on the determination that the $V_{DDMIN}$ associated with the first and second bitcells has increased.

17. The method of claim 11, further comprising
coupling a frequency adjustment module to the first and second bitcells;
configuring the frequency adjustment module to set a clock frequency associated with the first and second bitcells to a first value;
configuring the aging sensor to determine that a minimum supply voltage $V_{DDMIN}$ associated with the first and second bitcells has increased; and
configuring the frequency adjustment module to adjust the clock frequency associated with the first and second bitcells based on the determination that the $V_{DDMIN}$ associated with the first and second bitcells has increased.

18. A static random-access memory (SRAM) array, comprising:
means for determining an amount of aging associated with an aging transistor based on a difference between a voltage or a current associated with the aging transistor and a voltage or a current associated with a non-aging transistor, wherein the aging transistor is included in a first bitcell coupled to a bitline of the SRAM array, and wherein the non-aging transistor is included in a second bitcell coupled to a complementary bitline of the SRAM array; and
means for adjusting a supply voltage $V_{DD}$ associated with the first and second bitcells based on the amount of aging determined for the aging transistor.

19. The static random-access memory (SRAM) array of claim 18, wherein the means for determining the amount of aging associated with the aging transistor comprises means for determining a voltage difference between the bitline coupled to the first bitcell and the complementary bitline coupled to the second bitcell.

20. The static random-access memory (SRAM) array of claim 18, wherein the means for determining the amount of aging associated with the aging transistor comprises means for determining a current difference between a bitline coupled to the first bitcell and a complementary bitline coupled to the second bitcell.

21. The static random-access memory (SRAM) array of claim 18, further comprising a means for setting the $V_{DD}$ associated with the first and second bitcells to a first value, wherein the means for determining the amount of aging associated with the aging transistor further comprises means for determining that a minimum supply voltage $V_{DDMIN}$ associated with the first and second bitcells has increased, and wherein the means for determining the amount of aging associated with the aging transistor further comprises means for increasing the $V_{DD}$ to a second value greater than the first value based on the determination that the $V_{DDMIN}$ associated with the first and second bitcells has increased.

22. The static random-access memory (SRAM) array of claim 18, further comprising a means for setting a clock frequency associated with the first and second bitcells to a first value, wherein the means for determining the amount of aging associated with the aging transistor further comprises means for determining that a $V_{DDMIN}$ associated with the first and second bitcells has increased, and wherein the means for determining the amount of aging associated with the aging transistor further comprises means for increasing the clock frequency to a second value greater than the first value based on the determination that the $V_{DDMIN}$ associated with the first and second bitcells has increased.

* * * * *